United States Patent [19]
Tang

[11] Patent Number: 5,561,584
[45] Date of Patent: Oct. 1, 1996

[54] ELECTRICAL GROUND PLANE APPARATUS

[75] Inventor: Engne Tang, Lexington, Mass.

[73] Assignee: Vimak Corporation, Woburn, Mass.

[21] Appl. No.: 129,441

[22] Filed: Sep. 30, 1993

[51] Int. Cl.$^6$ ............................................ H05F 3/00
[52] U.S. Cl. .......................... 361/220; 361/784; 361/792; 361/816
[58] Field of Search ....................... 361/220, 784, 361/792, 794, 795, 799, 800, 816; 174/250, 255, 260, 261, 262, 264; 302/91

[56]  References Cited

U.S. PATENT DOCUMENTS

| 5,231,308 | 7/1993 | Fisch | 361/816 |
| 5,287,008 | 2/1994 | Pahr | 307/91 |

Primary Examiner—Jeffrey A. Gaffin
Attorney, Agent, or Firm—Dick and Harris

[57]     ABSTRACT

An electrical ground plane apparatus for a circuit board having an analog section and a digital section where the analog section of the circuit board has distributed thereon analog circuitry, and the digital section has distributed thereon digital circuitry. The analog section further has a connector which connects the analog circuitry to circuitry external to the circuit board. The circuit board is disposed within a chassis, which is operably connected to earth ground. The electrical ground plane apparatus includes an analog ground, a digital ground and a coupling circuit. The digital ground is operably connected to the analog ground at a location proximate the power supply connection and the analog ground is operably connected to the chassis through a coupling circuit. The coupling circuit is located proximate the connector so as to substantially minimize the flow of RF energy into the connector and, in turn, into the external circuitry.

6 Claims, 1 Drawing Sheet

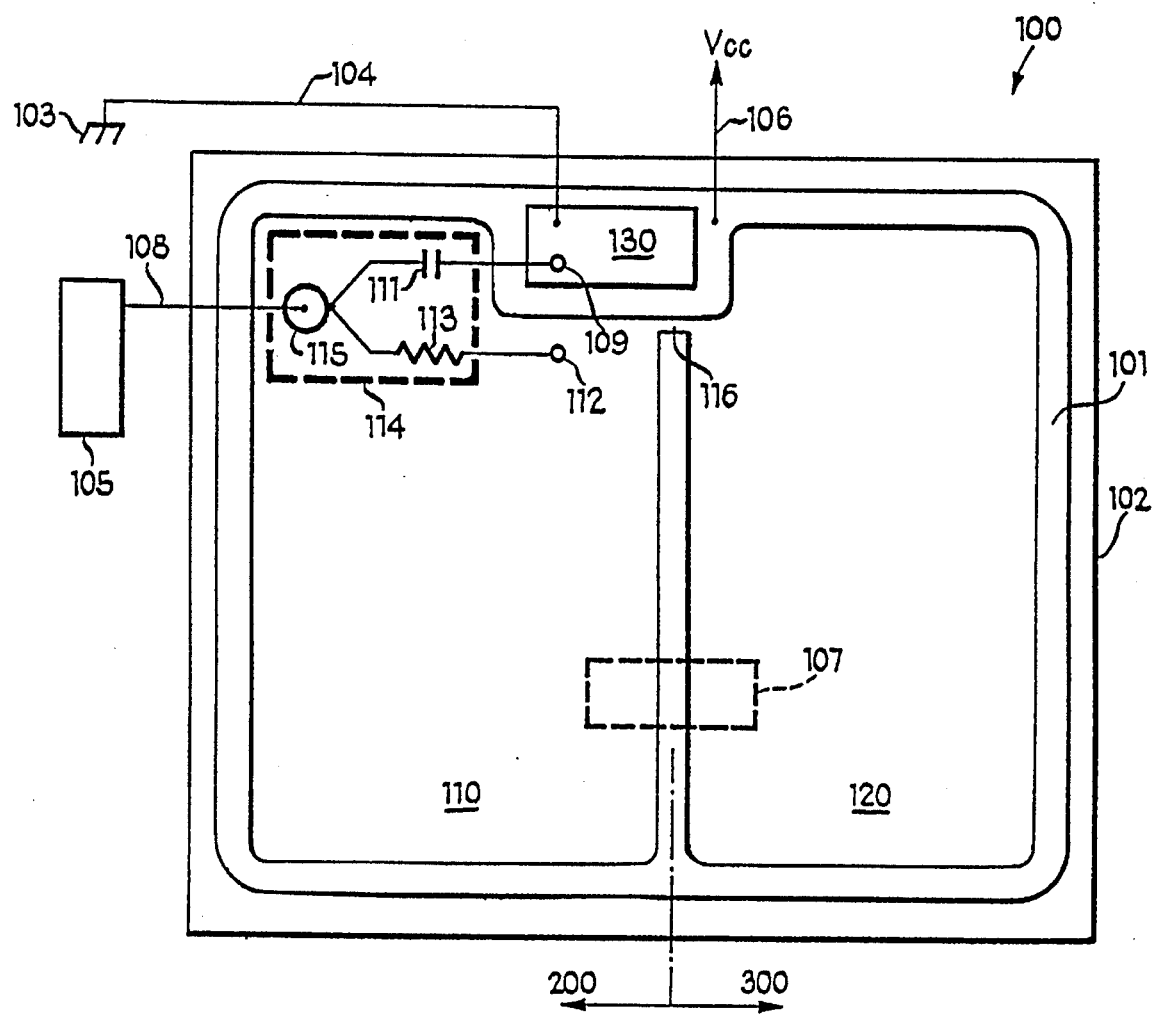

ELECTRICAL GROUND PLANE APPARATUS

BACKGROUND OF THE INVENTION

The present invention relates in general to power supplies for electrical circuits implemented upon printed circuit boards and, in particular, to an electrical ground plane apparatus which provides for direct coupling of analog and digital circuitry, while substantially minimizing the injection of RF noise into circuits operably connected to the protected circuit board.

The problems associated with placing analog and digital circuitry onto the same circuit board are well known in the art. The most significant problems arise from the high RF noise produced by digital circuits which typically interferes with sensitive, noise-susceptible analog circuitry. These problems have been traditionally circumvented by circuit designers by isolating the analog and digital sections from one another.

One prior art solution involves the physical and/or mechanical separation of analog and digital sections. While certain circuits may be protected in this manner, however inelegant, such protection is at the expense of increased costs and the consumption of excess space. In some prior art circuit boards, analog and digital circuitry is disposed upon the same circuit board, however they are coupled together through expensive isolation amplifiers or optical coupling devices. While this approach allows construction of a hybrid circuit board, the expense and the distortion, noise and power consumption of isolation amplifiers and optical coupling devices are not very desirable. Moreover, in applications incorporating IC based analog-to-digital converters the analog and digital sections are inherently spanned and isolation impractical.

In some of these prior designs each of the analog and digital sections have had individual connections to earth ground. These multiple ground paths could potentially create a "ground loop" which would serve as a path for signals to flow from one ground to another, resulting in unwanted noise within the circuitry.

Some prior art hybrid circuit board designs may result in RF energy being injected through cabling connecting the hybrid circuit to an external circuit. In an audio signal apparatus the injection of noise into a connector cable will likely effect the signal source in two ways: noise current injection and radiative waves due to the "antenna effect" of the cable. The radiative interference will sometimes suppress a weak radio station and not allow a nearby tuner to receive the station signal. These effects result in interference and a poor quality signal, as RF noise injected and radiated to the signal source will return to the hybrid circuit as a noise which is processed along with the intended audio signal.

It is thus an object of the present invention to provide an electrical ground plane apparatus that allows the analog and digital sections to be directly coupled avoiding the need for isolation which, in turn, results in lower manufacturing costs and improved signal response.

It is an additional objection of the present invention to provide an electrical ground plane apparatus that omits ground loops and, thus, closes other paths for noise.

It is a further object of the present invention to prevent the injection of RF energy into circuitry external to the circuit board.

These and other objects of the present invention will become apparent in light of the present specification, claims and drawing.

SUMMARY OF THE INVENTION

The present invention comprises an electrical ground plane apparatus for a circuit board having an analog section and a digital section. The analog section has distributed thereon analog circuitry, and the digital section has distributed thereon digital circuitry. The analog section further may include one or more connectors which connect the analog circuitry to circuitry external to the circuit board. In a preferred embodiment, the circuit board is disposed within a chassis, which is operably connected to earth ground.

The electrical ground plane apparatus includes an analog grounding means, a digital grounding means and a coupling means. The analog grounding means is operably connected to the digital grounding means at a location proximate the power supply connection so as to minimize circuit noise and the occurrence of ground loops. In the preferred embodiment, this operable connection comprises a single joining point between the analog and digital grounding means so as to avoid the formation of ground loops. In this preferred embodiment, this operable connection comprises a maximized metal trace such that the analog grounding means and the digital grounding means have approximately the same grounding potential.

The coupling means couples the analog grounding means to the chassis, which is, in turn, operably connected to earth. In a preferred embodiment, this earth ground connection is provided by a power input to the circuit board, which may comprise a shielded DIN jack. The coupling means, which in the preferred embodiment comprises an RC circuit, is proximate the connector so as to substantially minimize the flow of RF energy through the connector to the external circuitry. This apparatus further allows for direct coupling of the analog section to the digital section with insubstantial degradation in the performance from that which would be expected from separate independent analog and digital circuit boards.

BRIEF DESCRIPTION OF THE DRAWINGS

The Figure is a schematic block diagram of the present electrical ground plane apparatus.

DETAILED DESCRIPTION OF THE DRAWINGS

While this invention is susceptible of embodiment in many different forms, one specific embodiment is shown in the drawing and will herein be described in detail, with the understanding that the present disclosure is to be considered as an exemplification of the principles of the present invention and is not intended to limit the invention to the embodiment illustrated.

The Figure shows electrical ground plane apparatus 100 for use in association with circuit board 101. While a typical electrical circuit implemented on a printed circuit board possesses a ground layer and a component layer, only the ground layer is illustrated except for specific circuit portions present on the component side of the board which are shown surrounded by dashed lines. Circuit board 101 is disposed in association with chassis 102. Chassis 102 is operably connected to earth ground 103 through wire 104. This earth ground connection is provided by a power input cable to circuit board 102, and may comprise a shielded DIN jack. Power is supplied through wire 106.

Circuit board 101 has analog section 200 and digital section 300. Analog section 200 has distributed thereon analog circuitry, which may include operational amplifiers, potentiometers, switches, capacitors, etc. In one embodiment, the analog circuitry of analog section 200 may comprise an analog front end for analog-to-digital conversion circuit 107 which is also implemented on circuit board 101. Digital section 300 has distributed thereon digital circuitry, which may include Schmitt triggers, logic gates, etc. In the embodiment having analog-to-digital conversion circuit 107, the digital circuitry of digital section 300 may comprise the post conversion processing of the digital signal.

Analog section 200 further includes connector 115 which connects the analog circuitry to external circuitry 105. External circuitry 105 may comprise an FM tuner, an analog tape player, a phonograph, etc. In an embodiment where analog section 200 comprises a power supply and connector 115 a power distribution cable, external circuitry may be any type of electrical circuitry.

As depicted in the Figure, electrical ground plane apparatus 100 has means for grounding analog section 110. In a preferred embodiment, analog grounding means 110 comprises a trace on the ground side of the printed circuit board and is composed of copper. Although analog grounding means 110 is illustrated as being substantially rectangular in shape its may be of virtually any shape subject to the layout of the analog components on the component side of the printed board and further subject to the specific limitations outlined hereinbelow.

Electrical ground plane apparatus 100 further includes means for grounding digital section 120. In a preferred embodiment, digital grounding means 120 comprises a trace on the ground side of the printed circuit board and is composed of copper. Although digital grounding means 120 is illustrated as being substantially rectangular in shape its may be of virtually any shape subject to the layout of the analog components on the component side of the printed board and further subject to the specific limitations outlined hereinbelow. The digital components present on digital section 300 generate a substantial amount of RF energy which is radiated by the digital circuitry connected thereto. While this RF energy is of little concern in the digital domain, it appears as noise to the analog circuitry in analog section 200.

Analog grounding means 110 is operably connected to digital grounding means 120. In a preferred embodiment, this operable connection comprises metal trace 116. Metal trace 116 has a certain resistance associated with it. Ideally, metal trace 116 should exert little if any resistance to noise signal flow such that both analog grounding means 110 and the digital grounding means 120 have the same grounding voltage in terms of the noise signal. By maximizing the thickness of metal trace 116 substantially the same grounding voltage is present on analog ground means 110 and digital ground means 120. Typically a metal trace such as metal trace 116 is on the order of 50 to 100 mils thick. In addition, it is preferable that the connection between analog grounding means 110 and digital grounding means 120 be made at a location proximate the power source 106 so as to prevent noise current from flowing throughout the analog circuits.

Coupling means 114 operably couples analog grounding means 110 to chassis 102. Coupling means 114 is positioned proximate connector 115 so as to substantially minimize the flow of RF energy through connector 115 to external circuitry 105. In a preferred embodiment, coupling means 114 comprises capacitor 111 and resistor 113. In this preferred embodiment capacitor 111 comprises a 0.33 microfarad film capacitor and resistor 113 comprises a 10 ohm metal film resistor. As illustrated, resistor 113 is connected between analog grounding means 110 and the ground shell of connector 115 while capacitor 111 is connected between the ground shell of connector 115 and chassis grounding means 130.

Coupling means 114, which in the preferred embodiment comprises an RC circuit, is located proximate connector 115 so as to substantially minimize the flow of RF energy through connector 115 to the external circuitry 105. This apparatus further allows for direct coupling of the analog section to the digital section with insubstantial degradation in the performance from that which would be expected from separate independent analog and digital circuit boards.

The foregoing description and drawing merely explain and illustrate the invention and the invention is not limited thereto except insofar as the appended claims are so limited, as those skilled in the art who have the disclosure before them will be able to make modifications and variations therein without departure from the scope of the invention.

What is claimed is:

1. An electrical ground plane apparatus for a circuit board disposed within a chassis, said chassis being operably connected to earth ground, said circuit board having an analog section and a digital section, said analog section having distributed thereon analog circuitry, said digital section having distributed thereon digital circuitry, said analog section further having a connector which connects said analog circuitry to circuitry external to said circuit board, said ground plane apparatus comprising:

means for grounding said analog section;

means for grounding said digital section said analog grounding means being operably connected to said digital grounding means; and means for coupling said analog grounding means to said chassis, said coupling means being proximate said connector and operably connecting said analog grounding means to said chassis so as to substantially minimize the flow of RF energy through said connector to a signal generating unit, while allowing for direct coupling of said analog section to said digital section.

2. The invention according to claim 1 wherein said coupling means comprises a resistor and a capacitor in series.

3. The invention according to claim 2 wherein said resistor has a first and second terminal and said capacitor has a third and fourth terminal, said first terminal being operably connected to said analog grounding means, said fourth terminal being operably connected to said chassis, each of said at least one connector is connected to said second and third terminals.

4. The invention according to claim 1 wherein said analog grounding means is operably connected to said digital grounding means through a single section proximate a power supply connection, said single section comprising a thick metal trace such that both said analog grounding means and said digital grounding means have approximately the same grounding potential, said single section further serving to preclude the formation of ground loops.

5. An electrical ground plane apparatus for a circuit board having an analog section and a digital section, said analog section having distributed thereon analog circuitry, said digital section having distributed thereon digital circuitry, said ground plane apparatus comprising:

means for grounding said analog section;

means for grounding said digital section, said analog grounding means being directly connected to said digital grounding means; and means for coupling said analog grounding means to said chassis.

6. An electrical ground plane apparatus for a circuit board having an analog section and a digital section, said analog section having distributed thereon analog circuitry, said digital section having distributed thereon digital circuitry, said ground plane apparatus consisting essentially of:

means for grounding said analog section;

means for grounding said digital section, said analog grounding means being operably connected to said digital grounding means; and means for coupling said analog grounding means to said chassis.

* * * * *

UNITED STATES PATENT AND TRADEMARK OFFICE
CERTIFICATE OF CORRECTION

PATENT NO. : 5,561,584
DATED : October 1, 1996
INVENTOR(S) : Engne Tang

It is certified that error appears in the above-indentified patent and that said Letters Patent is hereby corrected as shown below:

Col. 3, Line 11    After "105" insert
                   -- via wire 108 --.

Col. 4, Line 2     After "110" insert
                   -- (at connection 112) --.

Col. 4, Line 5     After "130" insert
                   -- (at connection 109) --.

Col. 4, Line 31    After "section" insert
                   -- , --.

Col. 4, Line 52    Delete "operably" and
                   insert instead
                   -- directly --.

Signed and Sealed this

Eleventh Day of March, 1997

Attest:

BRUCE LEHMAN

Attesting Officer    Commissioner of Patents and Trademarks